US000001423H

United States Statutory Invention Registration [19]

[11] Reg. Number: H1423

Flesner et al. [43] Published: Apr. 4, 1995

[54] METHOD FOR FABRICATING A SILICON-ON-INSULATOR VOLTAGE MULTIPLIER

[75] Inventors: Larry D. Flesner; Graham A. Garcia; George P. Imthurn, all of San Diego, Calif.

[73] Assignee: The United States of America as represented by the Secretary of the Navy, Washington, D.C.

[21] Appl. No.: 988,551

[22] Filed: Dec. 10, 1992

[51] Int. Cl.[6] ..... H01L 29/00

[52] U.S. Cl. ..... 257/347; 257/350; 257/352

[58] Field of Search ..... 257/347, 350, 352, 353, 257/354, 501, 506

[56] References Cited

U.S. PATENT DOCUMENTS

| | | | |
|---|---|---|---|
| 4,241,360 | 12/1980 | Hambor et al. | 257/700 |
| 4,501,060 | 2/1985 | Frye et al. | 257/506 |
| 4,520,461 | 5/1985 | Simko | 257/317 |
| 4,575,746 | 3/1986 | Dingwall | 257/353 |
| 4,922,403 | 5/1990 | Feller | 257/368 |
| 5,014,097 | 5/1991 | Kazerounian | 257/317 |

FOREIGN PATENT DOCUMENTS

| | | | |
|---|---|---|---|
| 56-105677 | 8/1981 | Japan | 257/350 |
| 57-31177 | 2/1982 | Japan | 257/353 |
| 61-232655 | 10/1986 | Japan | 257/506 |

OTHER PUBLICATIONS

"Method to Form Very Thin SOI Films", IBM Technical Disclosure Bulletin, vol. 35, #2 Jul. 1992, pp. 37–38.

"Process for Fabrication of Very Thin Epitaxial Silicon Films Over Insulating Layers," IBM Technical Disclosure Bulletin, vol. 35, #2, Jul. 1992, pp. 247–249.

*Primary Examiner*—Bernarr E. Gregory

*Attorney, Agent, or Firm*—Harvey Fendelman; Thomas Glenn Keough; Michael A. Kagan

[57] ABSTRACT

The present invention provides a method for fabricating a silicon-on-insulator voltage multiplier. The method comprises the steps of: forming a first silicon layer having a first concentration of a first dopant with a first polarity on a silicon wafer having a second concentration of a second dopant with a second polarity opposite the first polarity to create a diode junction; forming a second silicon layer on the first silicon layer, the second silicon layer having a third concentration of a third dopant having the first polarity, where the third concentration is greater than the first concentration of the first dopant; forming a silicon dioxide layer on the second silicon layer by thermal oxidation; bonding an insulating substrate to the silicon dioxide layer to create a bonded wafer, where the insulating substrate is selected from the group consisting of quartz, glass, sapphire, and silicon dioxide on silicon; thinning the silicon wafer to form a thinned silicon layer; etching the bonded wafer to form a plurality of separate diodes having sloped sidewalls and to expose selected regions of the insulating substrate; forming an insulating silicon layer on the selected regions of the insulating substrate and on the separate diodes; exposing selected regions of the thinned silicon layer and regions of the second silicon layer of each of the diodes; and forming metal interconnects between the exposed selected regions of the thinned silicon layer of one of the diodes with the silicon layer of another of the diodes.

4 Claims, 4 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD FOR FABRICATING A SILICON-ON-INSULATOR VOLTAGE MULTIPLIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of voltage multiplier circuits, and more particularly, to a voltage multiplier incorporating diodes fabricated by bonding silicon to an insulating substrate and a method of fabricating same.

Voltage multiplier circuits employing capacitors and diodes to effect voltage multiplication by means of charge pumping are well known. Applications of voltage multiplier circuits include providing relatively high voltage within integrated circuits, and multiplying the voltage output of high voltage power supplies.

The simplest method of producing a voltage multiplier circuit is to wire together discrete diodes and capacitors. This method is generally employed for high voltage power supply applications. Another method of producing a voltage multiplier circuit is to integrate the diodes and capacitors on a semiconducting substrate as is done for applications within an integrated circuit. Both of these approaches have disadvantages for some applications. In the case of the discrete element circuits, the size of the circuit elements limits the number of multiplier stages which can be practicably implemented. Also, the frequency of the oscillatory charge pumping voltages is limited by the large size of the circuit elements. In the case of the integrated voltage multiplier circuits, the voltages which can be attained are limited by voltage induced breakdown between circuit elements and the semiconducting substrate on which the circuits are fabricated. The semiconducting substrate can also cause capacitive shunting of the oscillatory pumping voltages at high frequency.

An approach which avoids the limitations of prior art discussed above is to use an integrated voltage multiplier circuit fabricated on an insulating substrate. One silicon-on-insulator technology which can be employed is epitaxially grown silicon-on-sapphire (SOS). The problem with epitaxially grown SOS is that the high temperatures required in the fabrication process and differential thermal expansion effects cause relatively high reverse current leakage in SOS diodes. Low reverse leakage current is necessary for efficient voltage multiplier circuit operation. Thus, a need exists for voltage multiplier circuits having high quality diode devices integrated on an insulating substrate and a method for fabricating such circuits.

SUMMARY OF THE INVENTION

The present invention provides a method for fabricating a silicon-on-insulator voltage multiplier. The method comprises the steps of: forming a first silicon layer having a first concentration of a first dopant with a first polarity on a silicon wafer having a second concentration of a second dopant with a second polarity opposite the first polarity to create a diode junction; forming a second silicon layer on the first silicon layer, the second silicon layer having a third concentration of a third dopant having the first polarity, where the third concentration is greater than the first concentration of the first dopant; forming a silicon dioxide layer on the second silicon layer by thermal oxidation; bonding an insulating substrate to the silicon dioxide layer to create a bonded wafer, where the insulating substrate is selected from the group consisting of quartz, glass, sapphire, and silicon dioxide on silicon; thinning the silicon wafer to form a thinned silicon layer; etching the bonded wafer to form a plurality of separate diodes having sloped sidewalls and to expose selected regions of the insulating substrate; forming an insulating silicon layer on the selected regions of the insulating substrate and on the separate diodes; exposing selected regions of the thinned silicon layer and regions of the second silicon layer of each of the diodes; and forming metal interconnects between the exposed selected regions of the thinned silicon layer of one of the diodes with the silicon layer of another of the diodes.

The insulating substrate provides the advantages of extremely high breakdown voltage and very small parasitic capacitance between circuit elements. The advantages of integrated circuit fabrication are also realized, while the method of fabrication overcomes the problem of diode degradation caused by differential thermal expansion of the device layer and the substrate during high temperature processing. These advantages make possible voltage multiplier circuits with higher voltage capability, more multiplier stages, and higher operating frequency than is possible with conventional voltage multipliers.

DESCRIPTION OF THE PREFERRED EMBODIMENT

The present invention provides a voltage multiplier comprising diodes formed by bonding silicon to an insulating substrate which overcomes the aforementioned limitations of multipliers such as are taught in U.S. Pat. No. 4,922,402.

Figure 1:
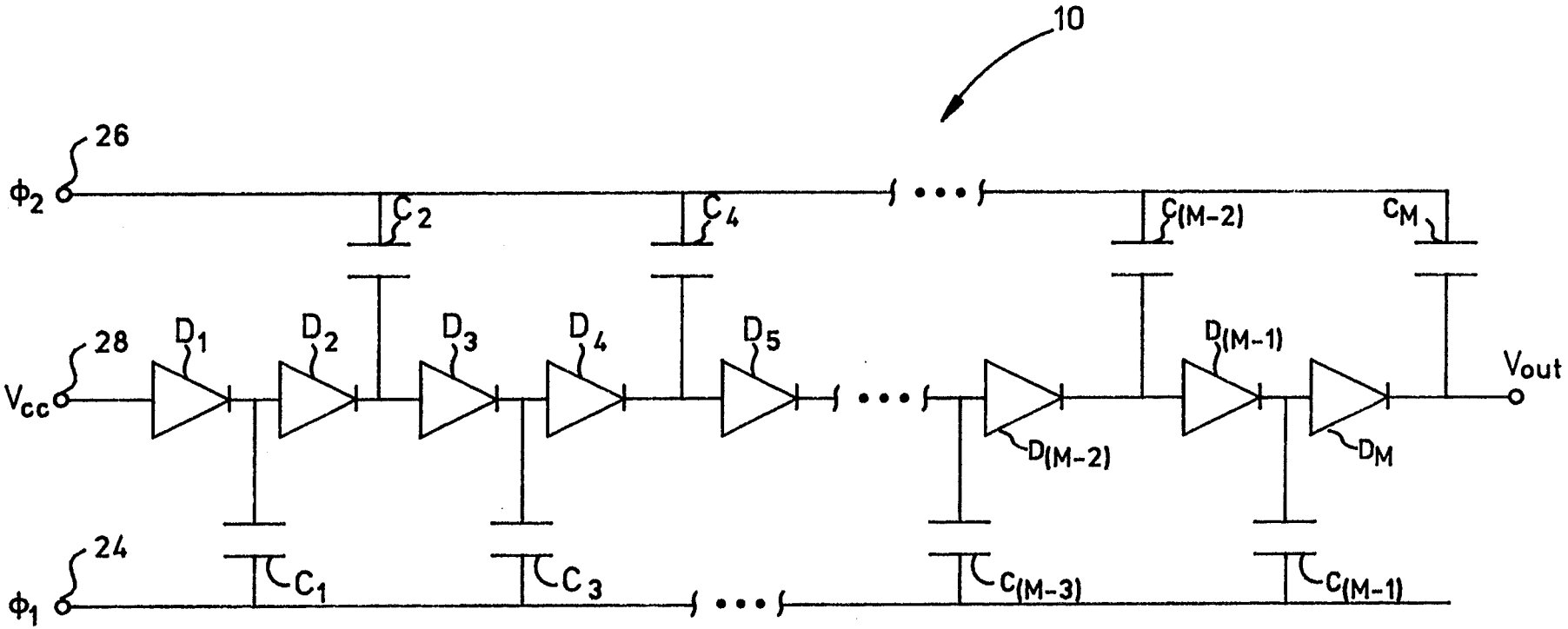
FIG. 1 is an electrical schematic representation of a voltage multiplier circuit.

Represented in FIG. 1 is a schematic diagram of an example of a voltage multiplier 10 embodying various features of the present invention which incorporates diodes $D_1, D_2, D_3, \ldots D_m$ formed by bonding silicon on an insulating substrate and which are interconnected with capacitors $C_1, C_2, C_3, \ldots C_m$. However, the circuit configuration of the voltage multiplier represented in FIG. 1 is presented by way of example only for the purpose of describing the implementation of the present invention. It is to be understood that the scope of the invention encompasses any voltage multiplier circuit comprising interconnected diodes which are formed by bonding silicon to an insulating substrate.

Figure 2:
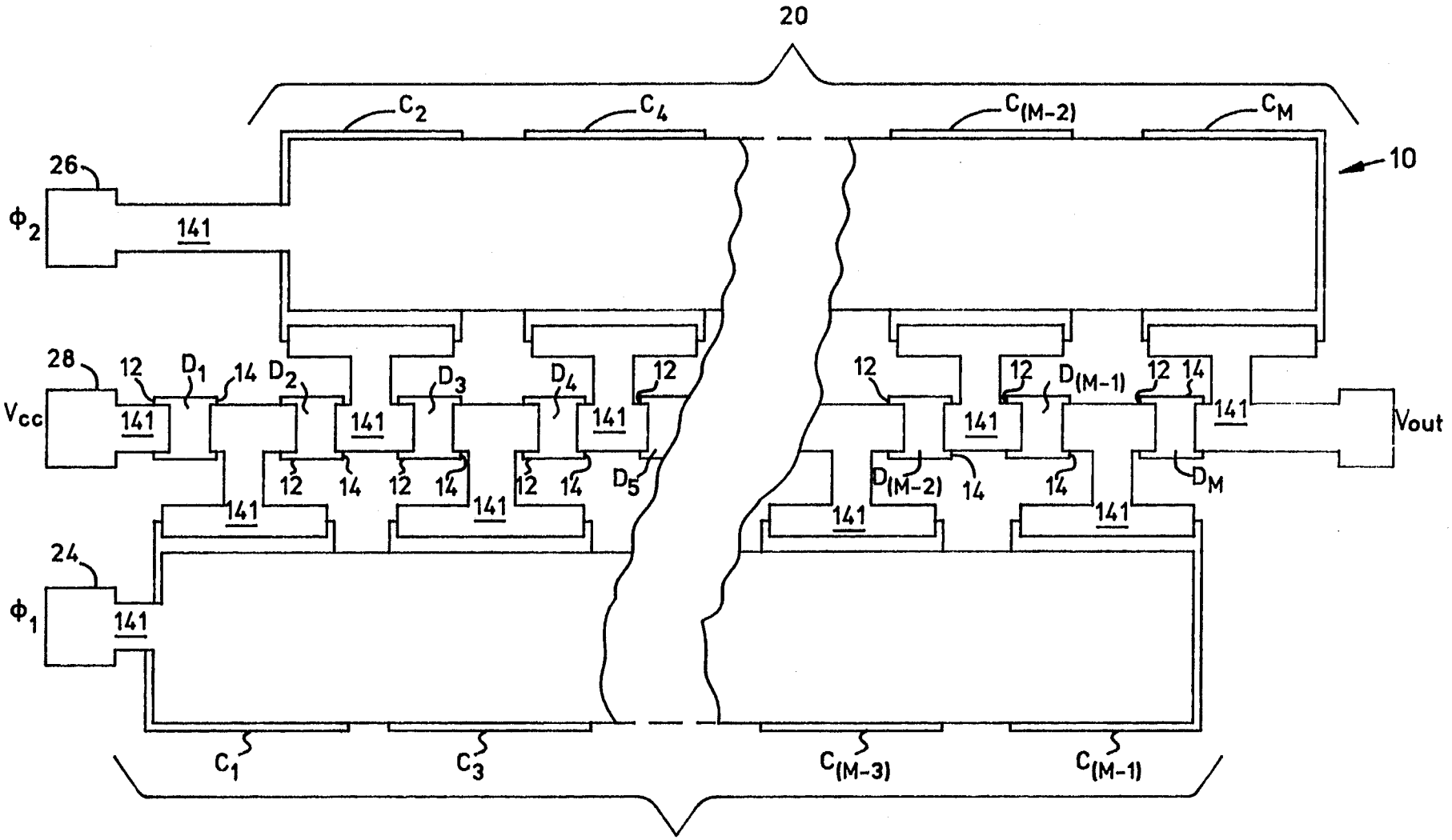
FIG. 2 illustrates an implementation of the voltage multiplier circuit of FIG. 1 formed by bonding silicon on an insulating substrate in accordance with the teachings of the present invention.

Referring to FIG. 2, there is shown the voltage multiplier 10, having an electrical circuit represented schematically in FIG. 1, comprising multiple diodes manufactured as described further herein by bonding silicon to an insulating substrate. The diodes preferably are interconnected to the capacitors on a single substrate. The voltage multiplier 10 is shown to include an m number of serially connected diodes, $D_1$, $D_2$, $D_3$, . . . $D_{(m-1)}$, $D_m$ each having an anode 12 and a cathode 14, where m is a positive integer. The cathode 14 of each diode $D_m$ is connected to the anode 12 of the immediately successive diode, $D_{(m+1)}$, where n is a positive integer and pb $0<n\leqq m$.

The odd numbered capacitors $C_1$, $C_3$, $C_5$, . . . of a first set 18 of capacitors are interconnected between successive pairs of diodes $D_1$and $D_2$, $D_3$ and $D_4$, etc, and an electrical contact 24 by a patterned metallization layer 141, shown in FIG. 2. The even numbered capacitors $C_2$, $C_4$, $C_6$, . . . of a second set of capacitors 20 are interconnected between successive pairs of diodes $D_2$ and $D_3$, $D_4$ and $D_5$, etc, and an electrical contact 26 by the metallization layer 141. The anode 12 of the diode $D_1$ is electrically connected by the metalization layer 141 to an electrical contact 28 disposed to receive the voltage $V_{cc}$ that is to be multiplied.

The operation of a voltage multiplier of the type represented by the voltage multiplier 10 of FIG. 2 is described with reference to FIG. 1. Phi 1 and phi 2 are two voltage pulse trains substantially in phase opposition between themselves, and which are generally generated by a suitable oscillator, not shown. By supposing ideal diode behavior, and phi 1 and phi 2 having an amplitude equal to the supply voltage, $V_{cc}$, the asymptotic level approached by the output voltage $V_{out}$, in an open circuit situation, is equal to p times $V_{cc}$, where p is the number of stages (corresponding to the number of serially connected diodes) of the multiplier circuit. Initially, where the capacitors are in a discharged state and where phi $1=V_{cc}$, and phi $2=0$, the $C_1$ capacitor charges to the $V_{cc}$ voltage, while the capacitor $C_2$ remains uncharged. When phi 1 and phi 2 switch because the diode $D_2$ cannot sustain a positive voltage across its terminals, the capacitor $C_1$ pours charge in the capacitor $C_2$, which thus charges to the voltage $V_{cc}$. A similar transfer of electrical charge will occur from all of the odd numbered capacitors to the even numbered capacitors represented in FIG. 1. When phi 1 and phi 2 switch again, the capacitor $C_1$ recharges through the supply, and no return of charge from $C_2$ occurs because the diode $D_1$ is reverse biased. Similarly all the other odd numbered capacitors recharge by means of the current provided by the preceding stage (to the left thereof in the diagram). Under open circuit conditions, i.e., when no current is drawn from the output terminal of the last stage, the output voltage $V_{out}$ will be decisively greater than $V_{cc}$ because of the transfer of electrical charge from the preceding stage. Moreover, the current drawn from the preceding stage upon any subsequent switching will become progressively smaller because the output capacitor will result already partially charged. At steady state, any intermediate node of the voltage multiplier assumes a voltage greater than that of the preceding intermediate stage by a quantity equal to the supply voltage. Therefore, the output voltage $V_{out}$ is equal to p times the supply voltage $V_{cc}$.

Figure 3:
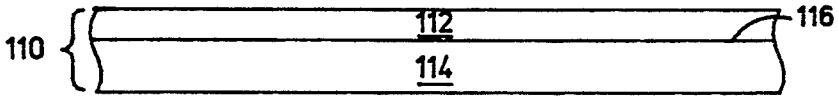
FIGS. 3–9 show cross-sectional views of the several stages in the manufacture of the serially connected diodes employed in the voltage multiplier of FIG. 2.

In an example of the manufacture of the diodes D comprising the voltage multiplier 10, as shown in FIG. 3, a silicon wafer structure 110 comprising a silicon layer 112 is formed on a silicon wafer 114. The silicon wafer 114 is doped with impurities to form either an n-type or p-type semiconductor. The layer 112 may be epitaxially grown or formed by ion implantation. As an example, the layer 112 may be epitaxially grown to a thickness of about 10 microns. The layer 112 is doped with impurities to form either an n-type or p-type semiconducting material. If the wafer 114 is n-type, then layer 112 is p-type, and vice-versa. By way of example, arsenic may be used to dope the silicon wafer 114 to form n-type material and boron may be used to dope the silicon layer 112 to form p-type material. The concentration of dopant in the wafer 114 is preferably about $10^{19}/cm^3$ or greater which facilitates the formation of ohmic contacts at a later stage in the manufacture of the diode circuit 10 formed on the silicon wafer structure 110. The doping concentration of the layer 112 is typically less than $10^{18}/cm^3$. The dopant concentrations and layer thicknesses are variable parameters which are selected to optimize the electrical properties of the diodes. A wide range of values for such parameters may provide satisfactory results. The interface 116 between the silicon layer 112 and silicon wafer 114 provides a diode junction. A diode junction is a junction between p-type and n-type semiconducting layers which produces rectification of electrical current flow.

Figure 4:
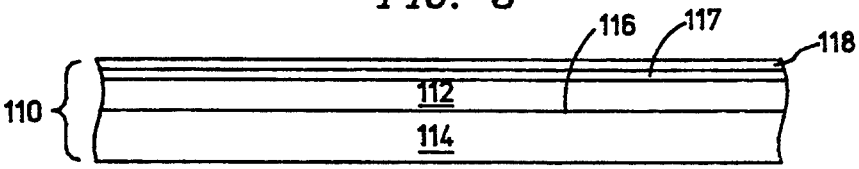

Next, as shown in FIG. 4, a dopant of the same polarity as that of the layer 112 is implanted or diffused into the silicon layer 112 to form a layer 117 which is more heavily doped than the rest of layer 112. For example, if the layer 112 includes n-type material with a doping concentration of about $10^{17}/cm^3$, then the layer 117 may include n-type material with a doping concentration of about $10^{19}/cm$. Such doping facilitates formation of ohmic contacts at a later stage to the diodes, set forth below. The formation of the layer 117 requires subjecting the silicon wafer structure 110 to a high temperature anneal. Such anneal is required to either promote diffusion if the layer 117 is formed by diffusion, or to activate ion-implanted dopant impurities if the layer 117 is formed by ion-implantation. A silicon dioxide layer 118 is formed on the layer 17 by thermal oxidation to provide a bonding surface, as described below.

By way of example, the thickness of the layer 117 is preferably in the range of about 100 to 500 nm. The ion-implanted dopants are activated by placing the silicon wafer structure 110 in a high temperature anneal, as for example, in an atmosphere of oxygen maintained at about 900° C. for about 25 minutes, during which time, the silicon dioxide layer 118, which may be about 50 to 100 nm thick, is grown in the layer 117. The silicon dioxide layer 118 is used as a bonding surface because it will adsorb hydroxyl ions which promote bonding between the silicon dioxide layer 18 and an insulating substrate to which the silicon wafer structure 110 is bonded, as described further herein.

Figure 5:
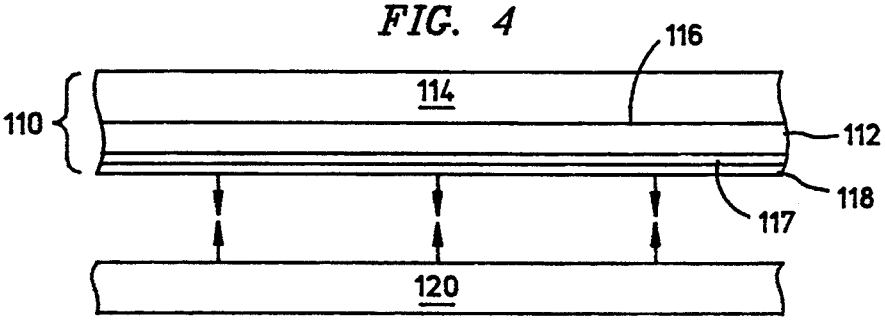

The insulating substrate is preferably a sapphire wafer 120, as shown in FIG. 5, although the insulating substrate may also be made of materials selected from the group consisting of quartz, glass, and silicon dioxide on silicon. The sapphire wafer 120 should be flat and polished to a mirror-like surface on at least one side having an RMS roughness, as for example, of less than 0.25 $\mu$m. Preferably, the silicon wafer structure 110 and sapphire wafer 120 are each approximately of the same size and shape. The surface of silicon dioxide layer 118 is generally smooth enough to bond well with the insulating substrate without polishing, particularly where the insulating substrate is the sapphire wafer 120.

Next, the sapphire wafer 120 and silicon wafer structure 110 are each cleaned, as for example, by a process such as an RCA clean, employing the hydrofluoric acid, hydrogen peroxide, and ammonium hydroxide cleaning, or by a hydrophilization bath using hydrogen peroxide and ammonium hydroxide. After cleaning, the sapphire and silicon wafers are rinsed in de-ionized water, and dried with heated nitrogen. The cleaning results in hydrolyzing, or adsorption of $^{-}$(OH) ions on the cleaned surfaces which promotes bonding between the sapphire wafer 120 and silicon wafer structure 110.

The silicon wafer structure 110 may be placed on a clean surface to expose the layer 118. Then, the polished surface of the sapphire wafer 120 is placed against the exposed surface of the layer 118 of the silicon wafer structure 110. The silicon wafer structure 110 and sapphire wafer 120, now in contact with each other, are heated to about 200° C. for a period which may range from 1 to 100 hours in air, nitrogen, or oxygen to create a bonded wafer 122. Generally, the application of pressure to hold the silicon wafer 114 and sapphire wafer 120 together is not necessary, although such compressive force may be provided if desired. The temperature at which the sapphire wafer 120 and silicon wafer structure 110 are heated is relatively low compared to temperatures employed in processes involving epitaxial growth, ion implantation, and diffusion. Such low temperature advantageously avoids the generation of thermally induced defects associated with the higher temperature processes normally used to grow silicon on sapphire. Thus, a major advantage of the present invention is that it provides a method for manufacturing a voltage multiplier on an insulating substrate such as sapphire wafer 120, where after being bonded together, the silicon wafer structure 110 and the insulating substrate are not subjected to temperatures which would cause the silicon to develop thermally induced cracks. After being allowed to cool to ambient temperature, the bonded wafer 122 may be handled without risk of separating the silicon wafer structure 110 from the sapphire wafer 120.

Figure 6:
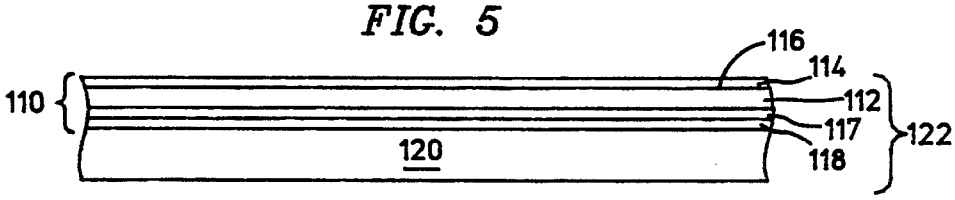

Next, as shown in FIG. 6, the silicon layer 114 may be thinned and thereby transformed into a thinned silicon layer 114 so that only a minimal thickness of about 100 to 1000 nm remains by any of the methods commonly employed in the art of thinning bonded wafers. Such processes may include, but are not limited to surface grinding, precision grinding with electrolytic in-process dressing, or ductile mode grinding.

Figure 7:
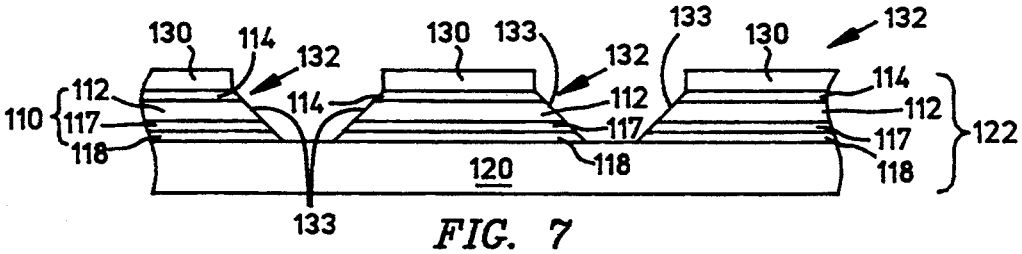

Referring now to FIG. 7, a layer of masking material 130 is deposited onto the surface of the thinned silicon layer 114 and patterned using well known lithographic techniques. An etch, using potassium hydroxide solution (KOH) or an isotropic plasma etch, for example, then may be performed so as to leave islands, now diodes 132 of silicon having sloped sidewalls 133 extending from the sapphire substrate 120. After the etch, the masking material 130 is removed. At this stage, the bonded wafer 122 includes a series circuit of diodes 132 which need to be electrically interconnected.

Figure 8:
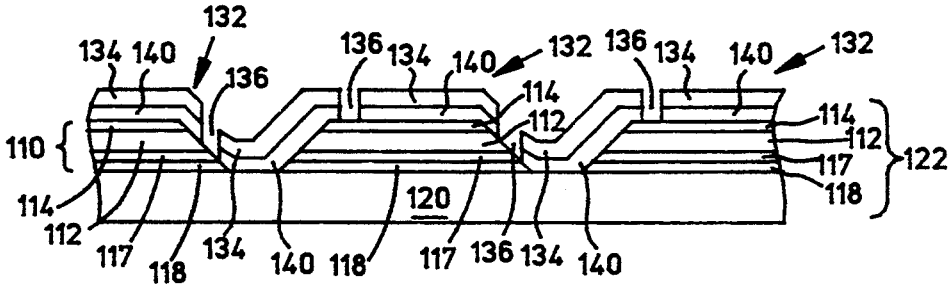

With reference to FIG. 8, a layer of silicon dioxide 140, which is thick enough to provide good electrical insulating properties (500 nm thickness is typically sufficient), is deposited over the diodes and exposed surface of the sapphire substrate 120. A layer of photoresist 134 is deposited on top of the layer of silicon dioxide 140, and then patterned using photolithographic techniques. The photoresist 134 serves as a mask for the etching of contact holes 136 in the layer of silicon dioxide 140 to expose selected regions of the silicon layer 117 and thinned silicon layer 114, shown in FIG. 8. Such exposure is facilitated by the sloped sidewalls 133 of the photodiodes 132. After patterning the layer of silicon dioxide 140 to create the contact holes 136, the layer of photoresist 134 is removed by any one of the commonly used methods for removing photoresist.

Figure 9:
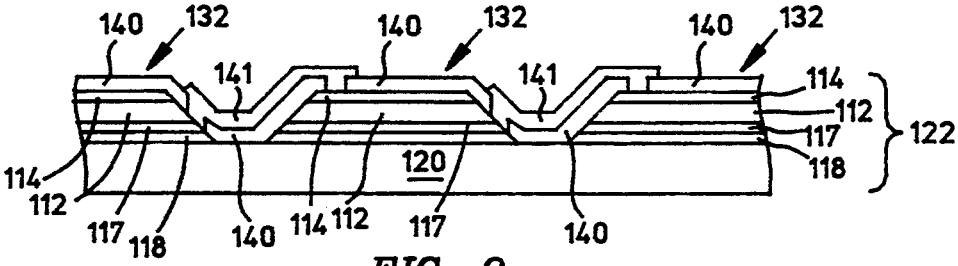

Referring now to FIG. 9, a metallization layer 141 is deposited over the photodiodes 132 and then is suitably patterned using well known photoresist masking methods to create a series circuit photocell array. The diode circuit is comprised of multiple, individual diodes 132 connected in series by interconnecting a heavily doped layer 117 of one diode 132 with the thinned silicon layer 114 of another diode 132, as shown in FIG. 9.

The p-type layers of the diodes constitute the anodes 12, and the n-type layers constitute the cathodes 14. The contacts to the anodes 12 and cathodes 14 occur at the openings or vias 136 in the oxide layer 140 as shown in FIG. 8.

Figure 10:
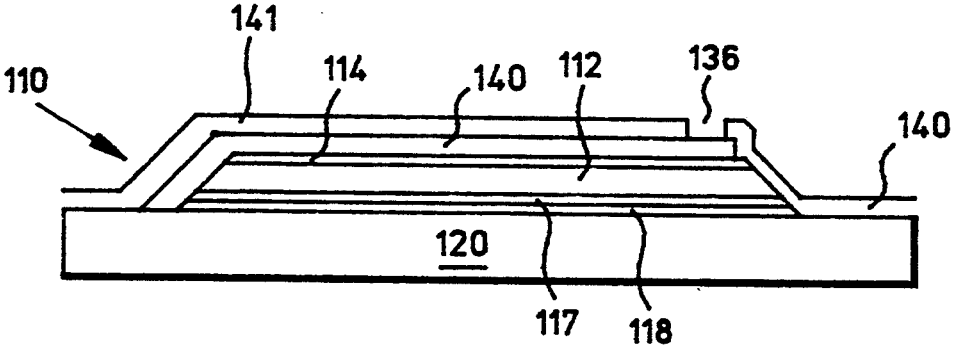
FIG. 10 is a cross-sectional view of an example of a capacitor which may be employed in the voltage multiplier circuit of FIG. 2.

The capacitors are formed during the same processing steps which form the diodes. Referring to FIG. 10, which is a vertical cross-section through the center of one of the capacitors shown in FIG. 2, the capacitors comprise one electrode which is formed by n-type and p-type silicon layers 114, 112, 117, and 118 mutually contacted by metal layer 141, an insulating dielectric layer 140, and a second electrode formed by overlying metal layer 141.

Obviously, many modifications and variations of the present invention are possible in light of the above teachings. It is therefore to be understood that within the scope of the appended claims, the invention may be practiced otherwise than as specifically described.

We claim:

1. A bonded silicon-on-insulator diode circuit, comprising:
- a bulk insulating substrate; and
- multiple diodes, each diode including:
  - a silicon dioxide layer bonded to said insulating substrate;
  - a silicon layer conjoined with said silicon dioxide layer; and
  - a p-n diode junction formed in said silicon layer, said silicon layer being differential thermal expansion defect free.

2. The bonded silicon-on-insulator diode circuit of claim 1 wherein said insulating substrate includes a material selected from the group of sapphire, quartz, glass, and silicon dioxide on silicon.

3. A voltage multiplier diode circuit, comprising:
- a bulk insulating substrate; and
- an electrical circuit formed on said bulk insulating substrate, said electrical circuit having a multiplicity of diodes and capacitors interconnected to form a voltage multiplier, each of said diodes including:
  - a silicon dioxide layer bonded to said insulating substrate;
  - a silicon layer conjoined with said silicon dioxide layer; and
  - a p-n diode junction formed in said silicon layer, said silicon layer being differential thermal expansion defect free.

4. The voltage multiplier diode circuit of claim 3 wherein said insulating substrate includes a material selected from the group of sapphire, quartz, glass, and silicon dioxide on silicon.

* * * * *